United States Patent
Lie et al.

(10) Patent No.: US 7,593,702 B1
(45) Date of Patent: Sep. 22, 2009

(54) OPEN-LOOP RF TRANSMITTER OUTPUT POWER CONTROL FOR INCREASED POWER EFFICIENCY

(75) Inventors: Donald Y. C. Lie, San Diego, CA (US); Jeremy Daniel Popp, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 631 days.

(21) Appl. No.: 11/449,183

(22) Filed: Jun. 6, 2006

Related U.S. Application Data (63) Continuation-in-part of application No. 11/387,083, filed on Mar. 16, 2006, now Pat. No. 7,420,421.

(51) Int. Cl.
*H01Q 11/12* (2006.01)
*H04B 1/04* (2006.01)

(52) U.S. Cl. ............ 455/127.2; 330/285; 330/297

(58) Field of Classification Search ........... 455/127.1, 455/127.2; 330/297, 296, 285, 129, 278
See application file for complete search history.

(56) References Cited

U.S. PATENT DOCUMENTS

| | | | |
|---|---|---|---|
| 6,356,745 B1 * | 3/2002 | Lee et al. | 455/232.1 |
| 6,405,054 B1 * | 6/2002 | Rozenblit et al. | 455/522 |
| 7,420,421 B1 * | 9/2008 | Lie et al. | 330/297 |

* cited by examiner

*Primary Examiner*—Nguyen Vo
(74) *Attorney, Agent, or Firm*—Kyle Eppele; Peter A. Lipovsky; J. Eric Anderson (57) ABSTRACT

Open-Loop RF Transmitter Output Power Control for Increased Power Efficiency (NC #98068) method includes determining a desired RF output power and obtaining a battery voltage value; determining a supply control voltage, a bias control voltage and a highest power efficiency; and transmitting selected values of the supply control voltage and the bias control voltage to supply control circuitry and bias control circuitry.

16 Claims, 7 Drawing Sheets

OPEN-LOOP RF TRANSMITTER OUTPUT POWER CONTROL FOR INCREASED POWER EFFICIENCY

CROSS-REFERENCE TO RELATED APPLICATION

This application is a continuation-in-part of Ser. No. 11/387,083 filed Mar. 16, 2006 now U.S. Pat. No. 7,420,421, issued on 2 Sep. 2008, entitled "Open-Loop RF Transmitter Output Power Control for Increased Power Efficiency" (NC #97507), hereby incorporated by reference herein in its entirety for its teachings, and referred to hereafter as "the parent application."

FEDERALLY SPONSORED RESEARCH AND DEVELOPMENT

The Open-Loop RF Transmitter Output Power Control for Increased Power Efficiency described herein is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice (619) 553-2778; email T2@spawar.navy.mil. Reference Navy Case Number 98068.

BACKGROUND

The patent application is generally in the field of power control.

Typical power amplifier power control uses closed-loop control techniques, which increases output power loss, reduces dynamic range and decreases stability.

A need exists for power amplifier power control having reduced output power loss, increased dynamic range and increased stability.

DETAILED DESCRIPTION

Described herein is an Open-Loop RF Transmitter Output Power Control for Increased Power Efficiency.

DEFINITIONS

The following definitions and acronyms are used herein:

Acronym(s)

BCV—Bias Control Voltage

BJT—Bipolar Junction Transistor

DC—Direct Current

FET—Field Effect Transistor

MOSFET—Metal Oxide Semiconductor Field Effect Transistor

OL—Open Loop

RF—Radio Frequency

SCV—Supply Control Voltage

SMPA—Switching Mode Power Amplifier(s)

Definition(s)

Switching Mode Power Amplifier—An amplifier that uses active devices as switching devices. The switching devices are used to control current and voltage so overlap is greatly reduced across the amplifier. Reducing overlap of current and voltage across the amplifier reduces energy dissipation in the active devices, which increases DC to RF power conversion efficiency.

The open-loop (OL) radio frequency (RF) transmitter output power control system includes a microprocessor, battery, bias control circuitry, supply control circuitry and power amplifier. The OL RF transmitter output power control system obtains a desired RF output power and battery voltage to determine a supply control voltage (SCV) and a bias control voltage (BCV) to apply to a power amplifier. The OL RF transmitter output power control system determines the BCV and SCV from the desired RF output power and battery voltage using power efficiency ratings. In one embodiment, the OL RF transmitter output power control system uses a lookup table to determine sets of BCV, SCV and power efficiency rating from the desired RF output power and battery voltage. Exemplary applications of the OL RF transmitter output power control system include portable wireless communication devices such as Bluetooth-enabled devices, wireless sensor networks, wireless LAN, RF keyless entry systems and RFID systems.

Figure 1:
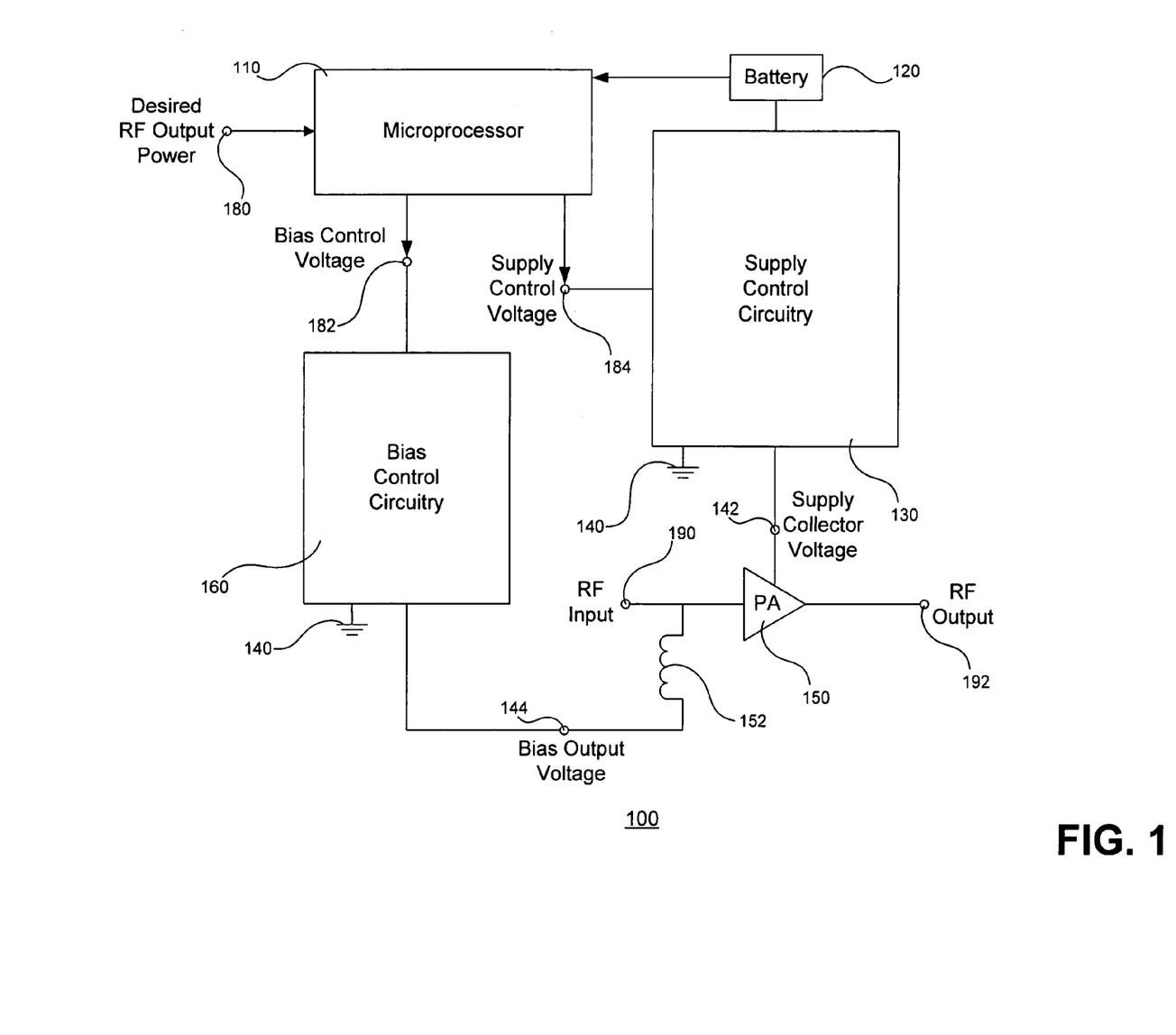
FIG. 1 is a diagram of one embodiment of an open-loop RF transmitter output power control.

FIG. 1 is a diagram of one embodiment of an OL RF transmitter output power control system. As shown in FIG. 1, OL RF transmitter output power control system 100 includes microprocessor 110, battery 120, supply control circuitry 130, bias control circuitry 160, power amplifier 150 and inductor 152. Microprocessor 110 is capable of receiving desired RF output power 180, which may be input from a user. Microprocessor 110 is operatively coupled to battery 120 and is capable of receiving a battery voltage value from battery 120. Microprocessor 110 is operatively coupled to supply control circuitry 130 and bias control circuitry 160. Microprocessor 110 is capable of transmitting supply control voltage 184 and bias control voltage 182 to supply control circuitry 130 and bias control circuitry 160, respectively.

Microprocessor 110 is capable of selecting sets of values for supply control voltage 184 and bias control voltage 182 based on power efficiency ratings and received values of desired RF output power 180 and battery voltage from battery 120. In one embodiment, microprocessor 110 selects a set of values for supply control voltage 184 and bias control voltage 182 to transmit to supply control circuitry 130 and bias control circuitry 160, respectively, based on highest power efficiency rating, desired RF output power 180 and battery voltage from battery 120. In one embodiment, microprocessor 110 uses a lookup table to select sets of values for supply control voltage 184 and bias control voltage 182.

As shown in FIG. 1, supply control circuitry 130 is operatively coupled to battery 120, microprocessor 110, power amplifier 150 and ground 140. Supply control circuitry 130 is capable of receiving battery voltage from battery 120. Supply control circuitry 130 is capable of receiving supply control voltage 184 from microprocessor 110. Supply control circuitry 130 is capable of transmitting supply collector voltage 142 to power amplifier 150. In one embodiment, supply control circuitry 130 comprises a Vdd amplifier or supply voltage amplifier. In one embodiment, supply control circuitry 130 comprises a switching mode amplifier. In one embodiment, supply control circuitry 130 comprises a switching mode amplifier that acts as a DC-DC converter.

Bias control circuitry 160 is operatively coupled to microprocessor 110, power amplifier 150 via inductor 152 and ground 140. Bias control circuitry 160 is capable of receiving bias control voltage 182 from microprocessor 110. Bias control circuitry 160 is capable of transmitting bias output voltage 144 to power amplifier 150 via inductor 152.

As shown in FIG. 1, power amplifier 150 is operatively coupled to supply control circuitry 130, bias control circuitry 160 via inductor 152, RF input 190 and RF output 192. Power amplifier 150 is capable of receiving an RF input signal from RF input 190. Power amplifier 150 is capable of receiving supply collector voltage 142 from supply control circuitry 130. Power amplifier 150 is capable of receiving bias output voltage 144 from bias control circuitry 160. Power amplifier 150 is capable of transmitting an amplified RF output signal to RF output 192. In one embodiment, power amplifier 150 comprises a switch mode power amplifier (SMPA).

In operation, microprocessor 110 of OL RF transmitter output power control system 100 receives desired RF output power 180 and a battery voltage value from battery 120. Desired RF output power 180 may be input by a user. Microprocessor 110 selects a pair of values for supply control voltage 184 and bias control voltage 182 based on power efficiency ratings and received values of desired RF output power 180 and battery voltage from battery 120. In one embodiment, microprocessor 110 uses a lookup table to select sets of values for supply control voltage 184 and bias control voltage 182. Bias control circuitry 160 and supply control circuitry 130 receive bias control voltage 182 and supply control voltage 184, respectively, from microprocessor 110. Power amplifier 150 receives an RF input signal, bias output voltage 144 and supply collector voltage 142 from RF input 190, bias control circuitry 160 and supply control circuitry 130, respectively. Power amplifier 150 transmits an amplified RF output signal to RF output 192.

Figure 2:
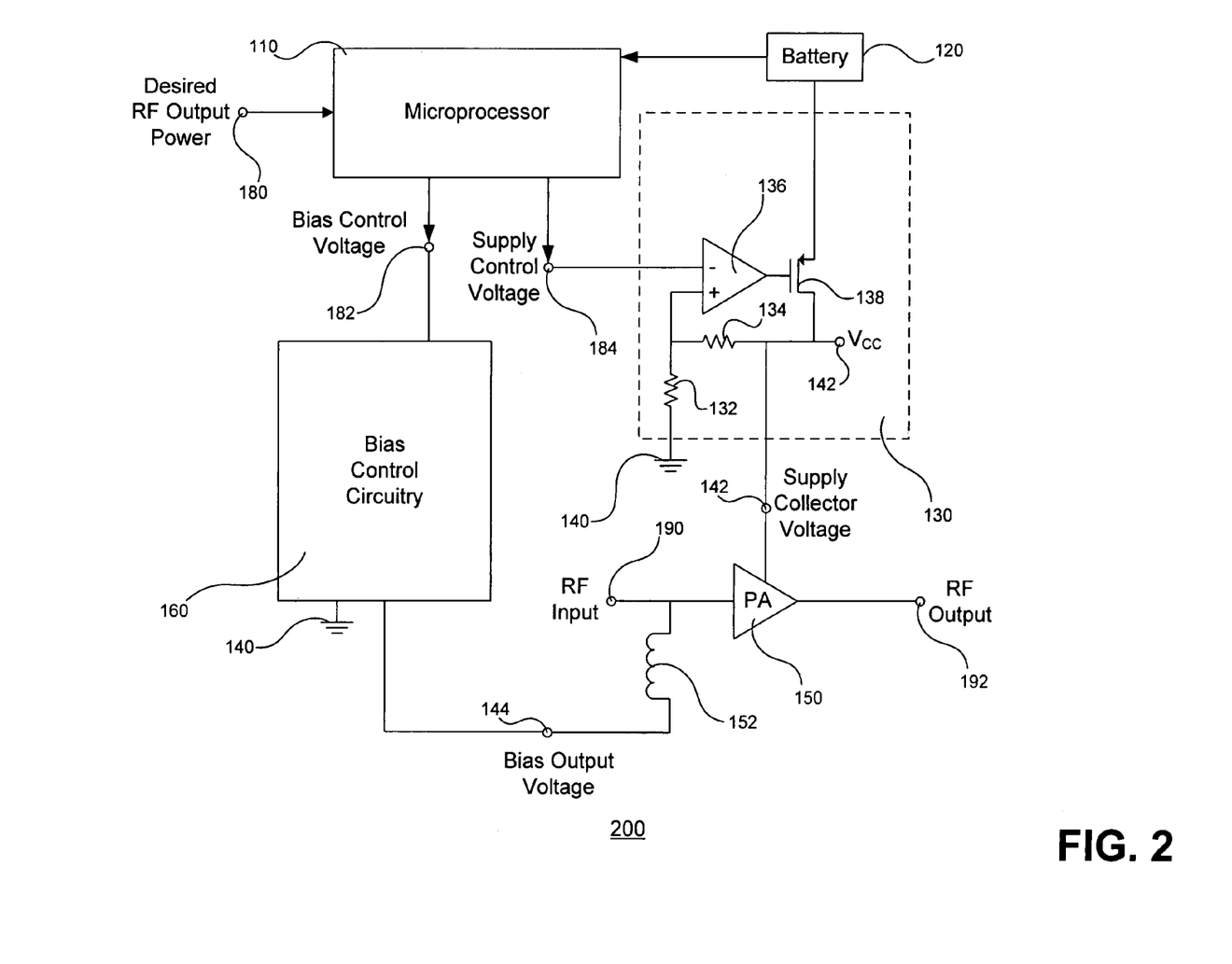
FIG. 2 is a diagram of one embodiment of an open-loop RF transmitter output power control.

FIG. 2 is a diagram of one embodiment of an OL RF transmitter output power control system. OL RF transmitter output power control system 200 of FIG. 2 is substantially similar to OL RF transmitter output power control system 100 of FIG. 1, and thus, similar components are not described hereinagain. As shown in FIG. 2, OL RF transmitter output power control system 200 includes microprocessor 110, battery 120, supply control circuitry 130, bias control circuitry 160, power amplifier 150 and inductor 152.

As shown in FIG. 2, supply control circuitry 130 includes ground resistor 132, collector resistor 134, operational amplifier 136, transistor 138 and supply collector voltage node 142. A negative input of operational amplifier 136 is operatively coupled to and receives supply control voltage 184 from microprocessor 110. A positive input of operational amplifier 136 is operatively coupled to a first terminal of ground resistor 132 and a first terminal of collector resistor 134. An output of operational amplifier 136 is operatively coupled to the gate of transistor 138. The source of transistor 138 is operatively coupled to and capable of receiving a voltage from battery 120. The drain of transistor 138 is operatively coupled to power amplifier 150 and a second terminal of collector resistor 134. A second terminal of ground resistor 132 is operatively coupled to ground 140. In one embodiment, transistor 138 comprises a uni-polar transistor. In one embodiment, transistor 138 comprises a Field Effect Transistor (FET). In one embodiment, transistor 138 comprises a Metal Oxide Semiconductor Field Effect Transistor (MOSFET).

Figure 3:
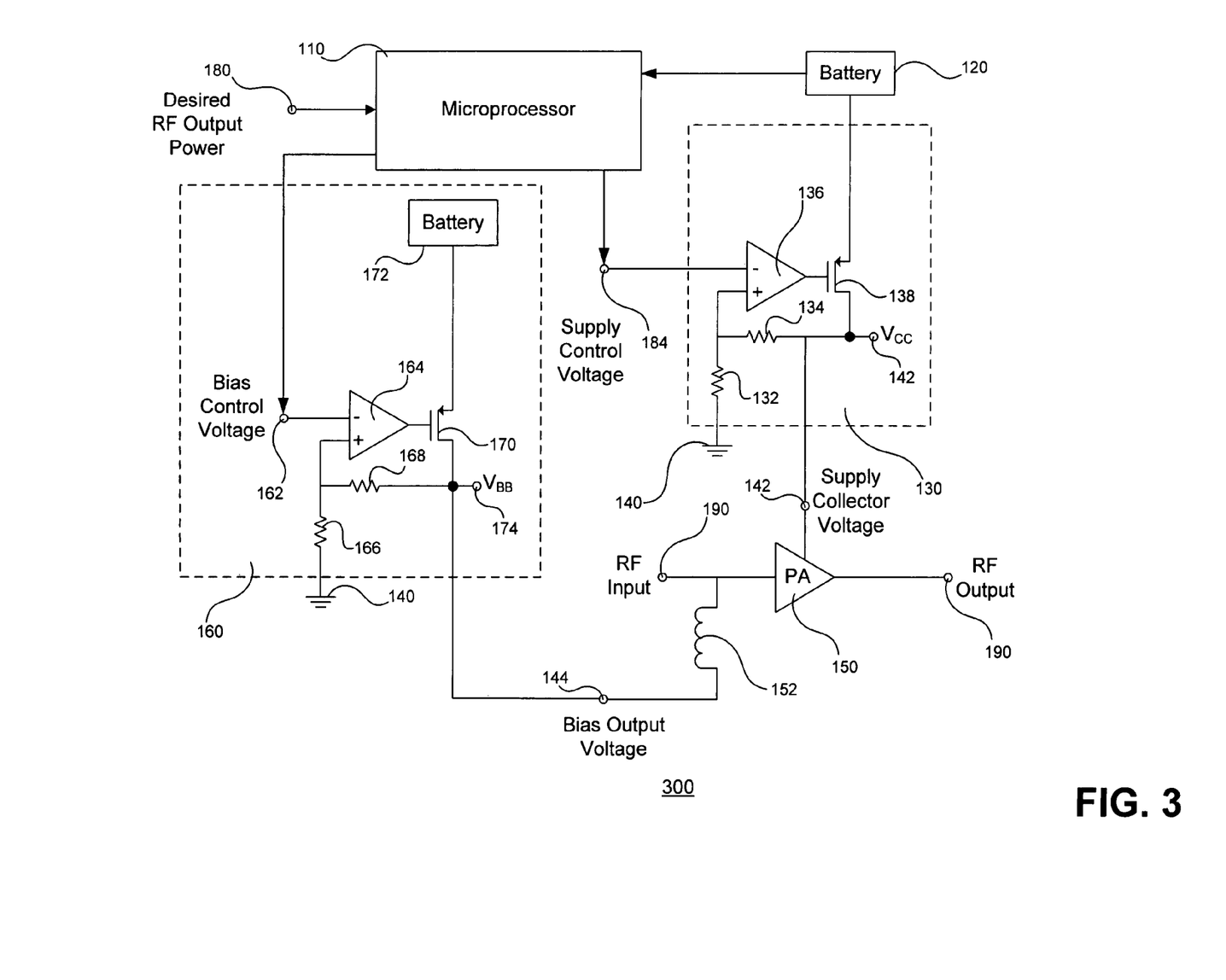
FIG. 3 is a diagram of one embodiment of an open-loop RF transmitter output power control.

FIG. 3 is a diagram of one embodiment of an OL RF transmitter output power control system. OL RF transmitter output power control system 300 of FIG. 3 is substantially similar to OL RF transmitter output power control system 200 of FIG. 2, and thus, similar components are not described hereinagain. As shown in FIG. 3, OL RF transmitter output power control system 300 includes microprocessor 110, battery 120, supply control circuitry 130, bias control circuitry 160, power amplifier 150 and inductor 152. Those skilled in the art shall recognize that supply control circuitry 130 of FIG. 3 is an exemplary circuit and supply control circuitry 130 can comprise other exemplary circuits such as a switching mode amplifier that acts as a DC-DC converter without departing from the scope or spirit of the OL RF transmitter output power control system.

As shown in FIG. 3, bias control circuitry 160 includes bias control circuitry battery 172, ground resistor 166, resistor 168, operational amplifier 164, transistor 170 and base bias voltage node 174. A negative input of operational amplifier 164 is operatively coupled to and receives bias control voltage 162 from microprocessor 110. A positive input of operational amplifier 164 is operatively coupled to a first terminal of ground resistor 166 and a first terminal of resistor 168. An output of operational amplifier 164 is operatively coupled to the gate of transistor 170. The source of transistor 170 is operatively coupled to and capable of receiving a bias battery voltage from bias control circuitry battery 172. Battery 172 and battery 120 may be the same battery. In one embodiment, battery 172 and battery 120 are the same battery. In one embodiment, battery 172 and battery 120 are different batteries. The drain of transistor 170 is operatively coupled to a second terminal of collector resistor 134 and power amplifier 150 via inductor 152 and is capable of transmitting bias output voltage 144 to power amplifier 150 via inductor 152. A second terminal of ground resistor 166 is operatively coupled to ground 140. In one embodiment, transistor 170 comprises a uni-polar transistor. In one embodiment, transistor 170 comprises a FET. In one embodiment, transistor 170 comprises a MOSFET.

Figure 4:
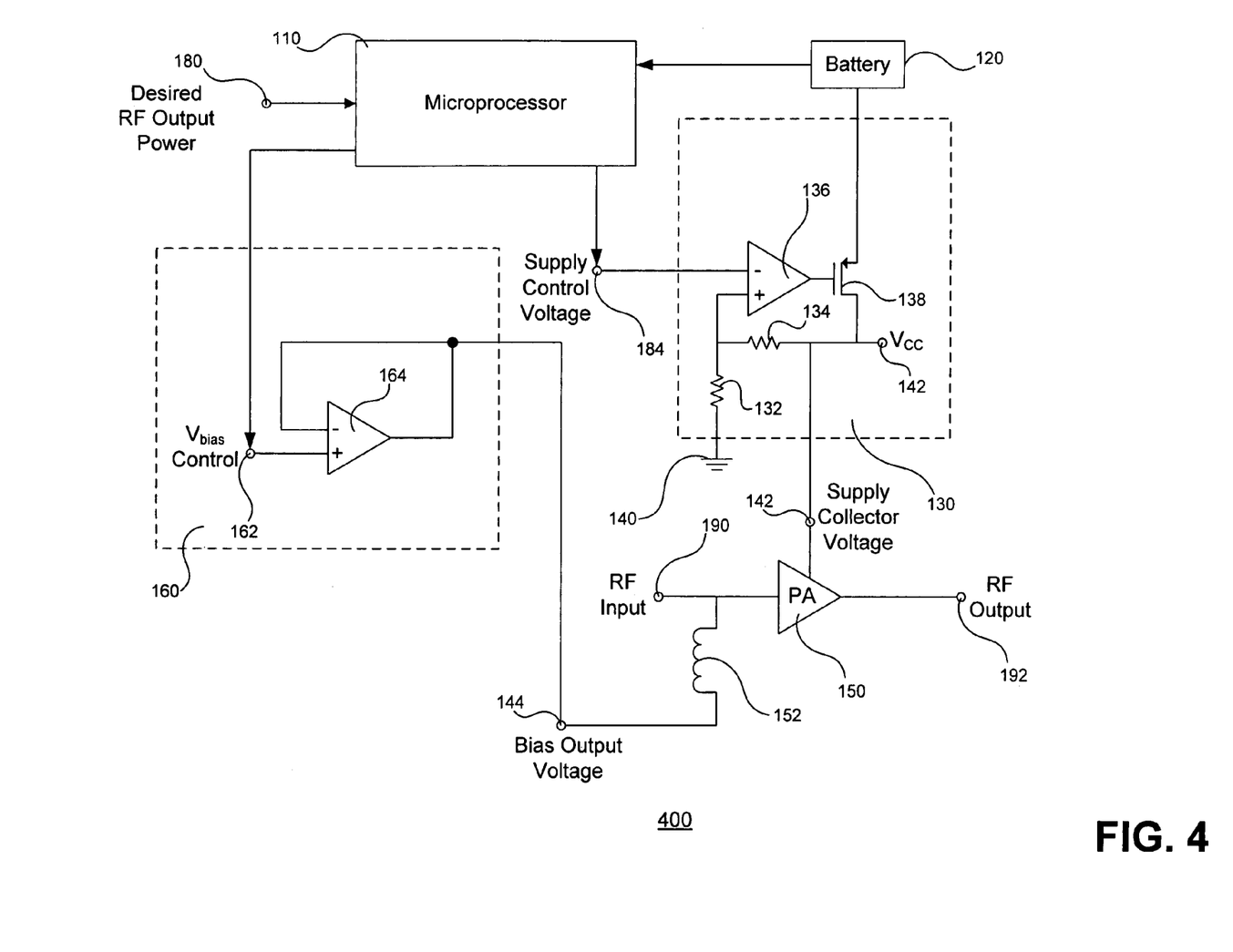
FIG. 4 is a diagram of one embodiment of an open-loop RF transmitter output power control.

FIG. 4 is a diagram of one embodiment of an OL RF transmitter output power control system. OL RF transmitter output power control system 400 of FIG. 4 is substantially similar to OL RF transmitter output power control system 200 of FIG. 2, and thus, similar components are not described hereinagain. As shown in FIG. 4, OL RF transmitter output power control system 400 includes microprocessor 110, battery 120, supply control circuitry 130, bias control circuitry 160, power amplifier 150 and inductor 152. Those skilled in the art shall recognize that supply control circuitry 130 of FIG. 4 is an exemplary circuit and supply control circuitry 130 can comprise other exemplary circuits such as a switching mode amplifier that acts as a DC-DC converter without departing from the scope or spirit of the OL RF transmitter output power control system.

As shown in FIG. 4, bias control circuitry 160 includes operational amplifier 164. A positive input of operational amplifier 164 is operatively coupled to and receives bias control voltage 162 from microprocessor 110. A negative input of operational amplifier 164 is operatively coupled to and receives a bias output voltage 144 from an output of operational amplifier 164. The negative input of operational amplifier 164 is also operatively coupled to power amplifier 150 via inductor 152. An output of operational amplifier 164 is operatively coupled to power amplifier 150 via inductor 152 and is capable of transmitting bias output voltage 144 to power amplifier 150 via inductor 152.

Figure 5:
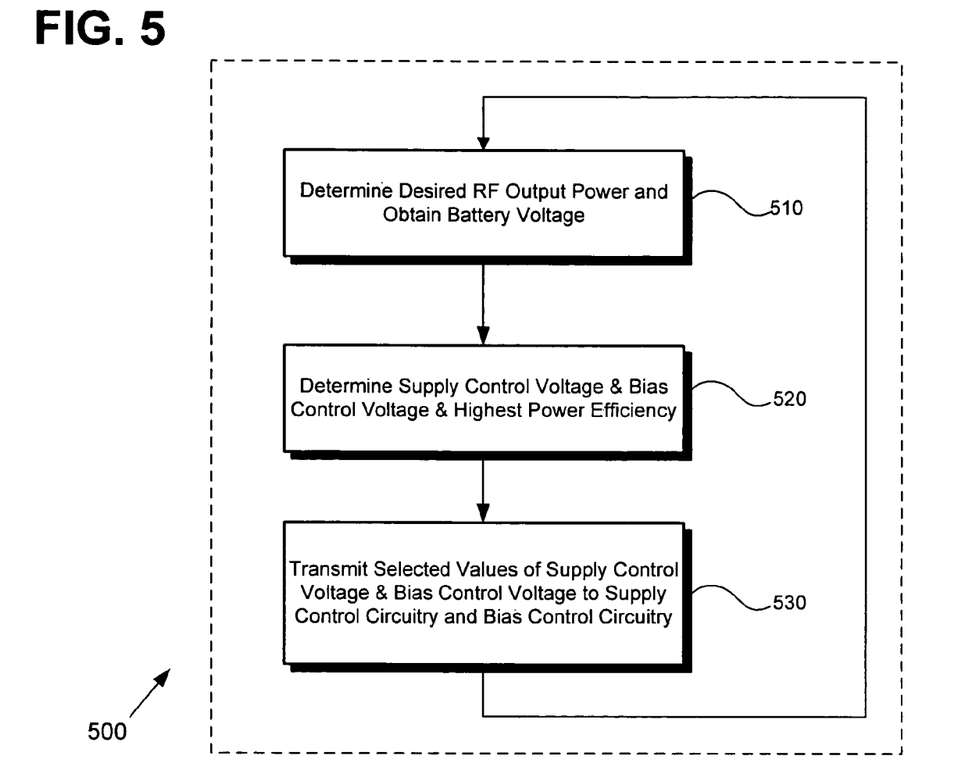
FIG. 5 is a flowchart of an exemplary method of one embodiment of an open-loop RF transmitter output power control.
Figure 6:
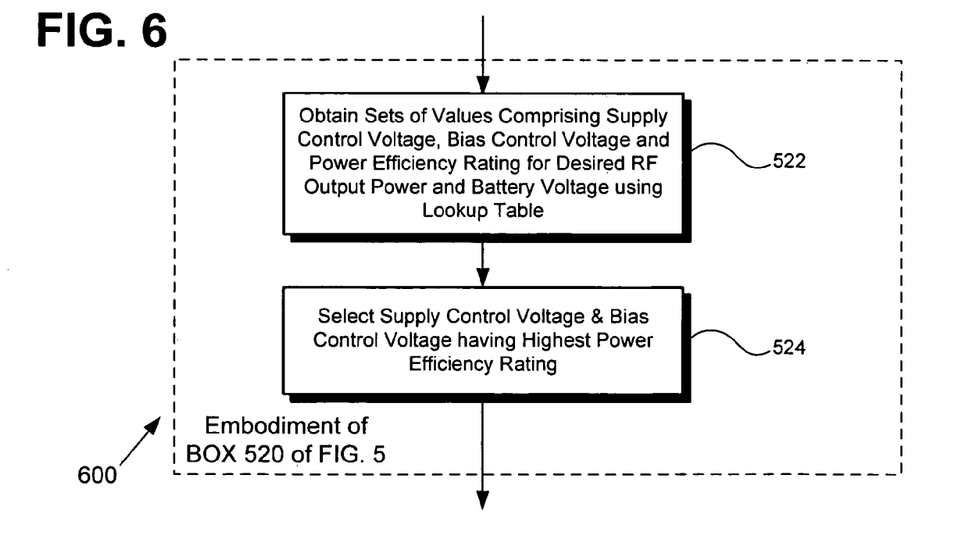
FIG. 6 is a flowchart of an exemplary method of one embodiment of an open-loop RF transmitter output power control.
Figure 7:
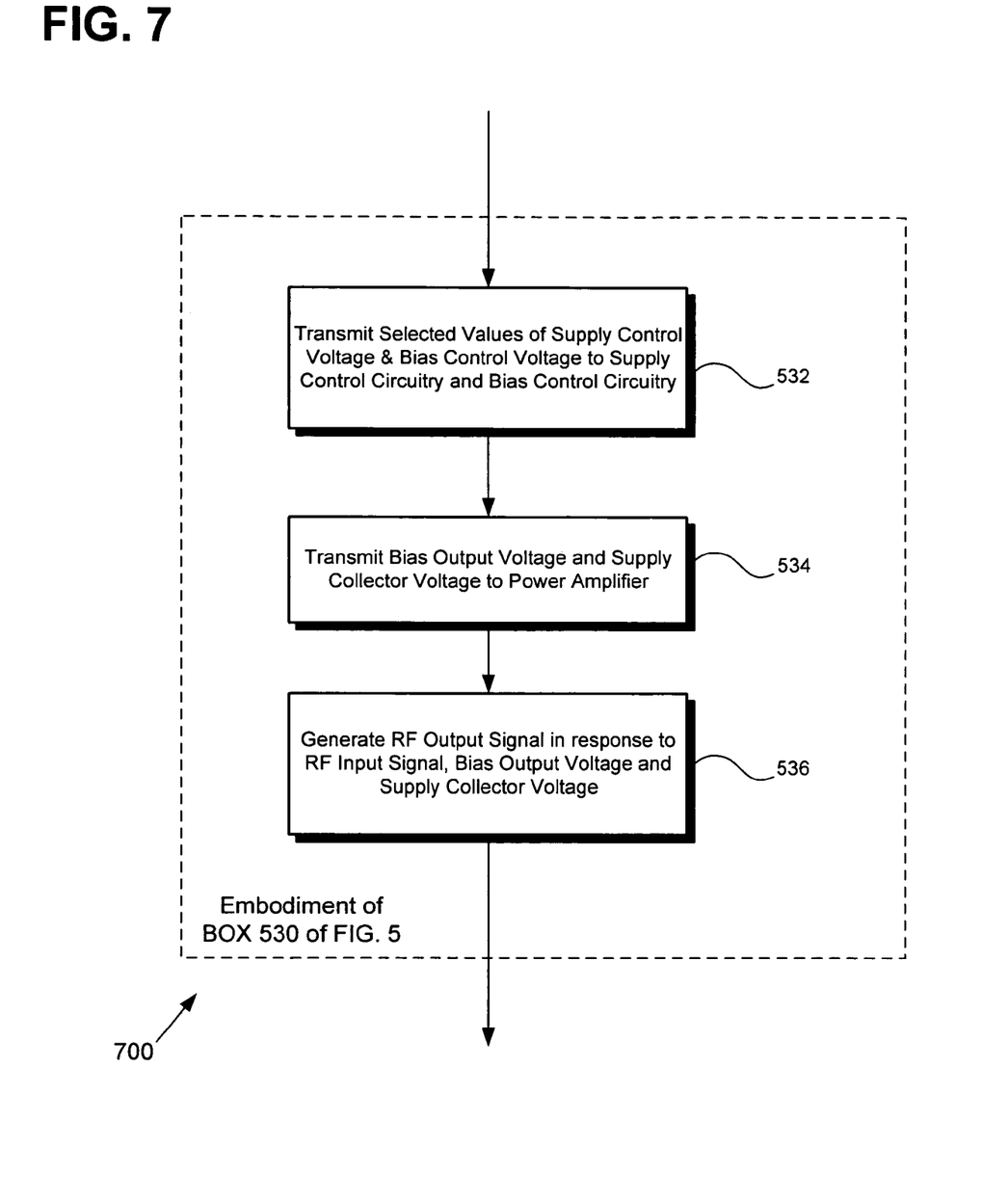
FIG. 7 is a flowchart of an exemplary method of one embodiment of an open-loop RF transmitter output power control.

FIGS. 5-7 are flowcharts illustrating exemplary methods to implement exemplary OL RF transmitter output power control. Certain details and features have been left out of FIGS. 5-7 that are apparent to a person of ordinary skill in the art. For example, a box may consist of one or more sub-boxes or may involve specialized equipment or materials, as known in the art. While boxes are sufficient to describe one embodiment of the OL RF transmitter output power control, other embodiments of the OL RF transmitter output power control may utilize boxes different from those shown in FIGS. 5-7.

FIG. 5 is a flowchart illustrating an exemplary method to implement exemplary OL RF transmitter output power control. Referring to FIG. 5, at BOX 510 in flowchart 500, the method determines a desired RF output power and obtains a value for battery voltage. In one embodiment, the method at BOX 510 determines the desired RF output power via user input. In one embodiment, the method at BOX 510 obtains the value for battery voltage via a battery voltage monitor. After BOX 510, the method proceeds to BOX 520. At BOX 520 in flowchart 500, the method determines supply control voltage, bias control voltage and highest power efficiency rating using desired RF output power and battery voltage. In one embodiment, the method at BOX 520 determines supply control voltage, bias control voltage and highest power efficiency rating using a lookup table. After BOX 520, the method proceeds to BOX 530. At BOX 530 in flowchart 500, the method transmits selected values of SCV and BCV to supply control circuitry and bias control circuitry, respectively. After BOX 530, the method returns to BOX 510.

FIG. 6 is a flowchart illustrating an exemplary method to implement exemplary OL RF transmitter output power control. FIG. 6 illustrates an embodiment of BOX 520 of flowchart 500 of FIG. 5. Referring to FIG. 6, at BOX 522 in flowchart 600, the method obtains sets of values comprising supply control voltage, bias control voltage and power efficiency rating for desired RF output power and battery voltage using a lookup table. After BOX 522, the method proceeds to BOX 524. At BOX 524 in flowchart 600, the method selects SCV and BCV values having the highest power efficiency rating. After BOX 524, the method proceeds to BOX 530 of flowchart 500 of FIG. 5.

FIG. 7 is a flowchart illustrating an exemplary method to implement exemplary OL RF transmitter output power control. FIG. 7 illustrates an embodiment of BOX 530 of flowchart 500 of FIG. 5. Referring to FIG. 7, at BOX 532 in flowchart 700, the method transmits the selected values of supply control voltage and bias control voltage to the supply control circuitry and bias control circuitry. After BOX 532, the method proceeds to BOX 534. At BOX 534 in flowchart 700, the method transmits bias output voltage and supply collector voltage to a power amplifier. After BOX 534, the method proceeds to BOX 536. At BOX 536 in flowchart 700, the method generates an RF output signal in response to an RF input signal, bias output voltage and supply collector voltage. After BOX 534, the method returns to BOX 510 of flowchart 500 of FIG. 5.

Figure 8:
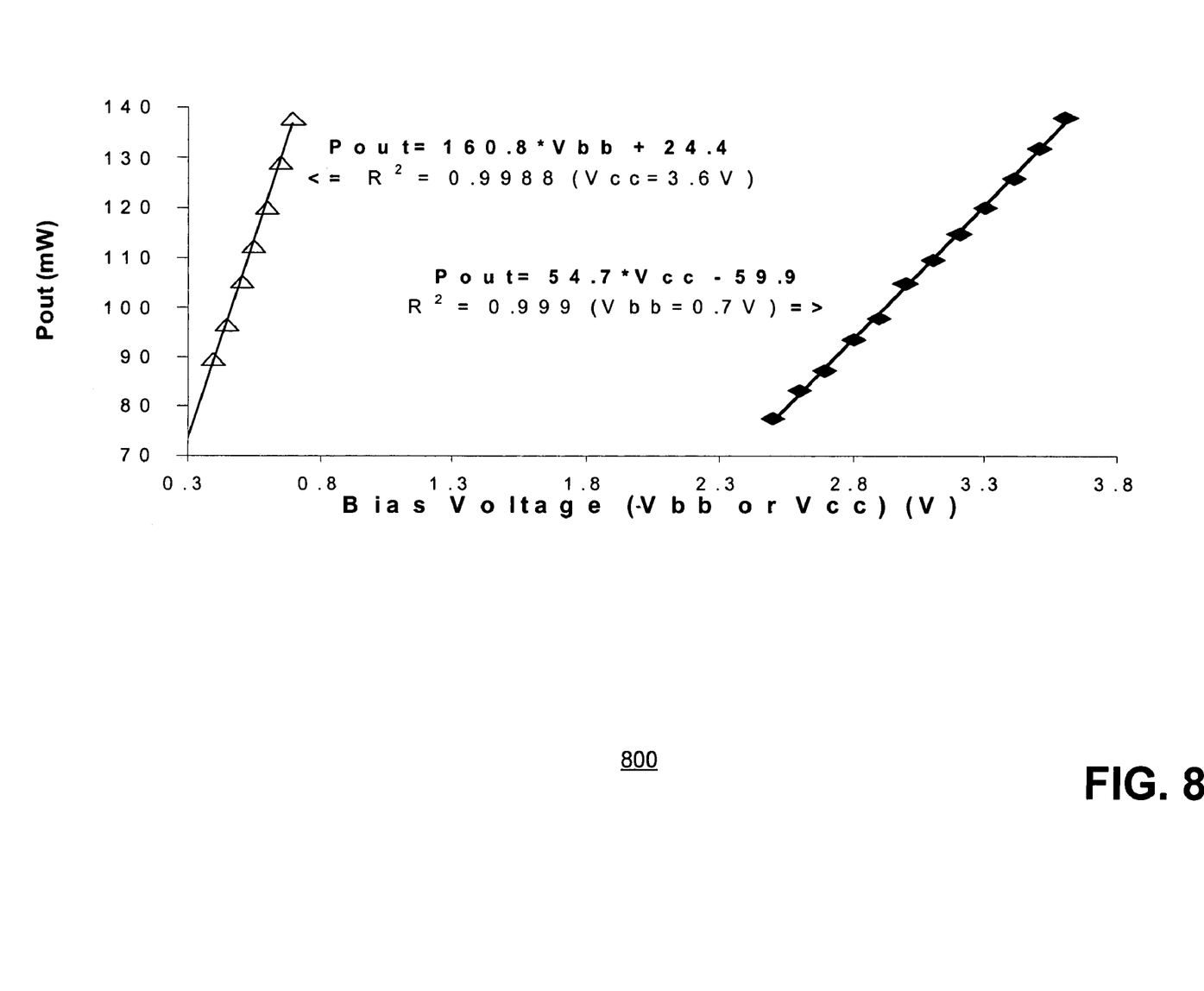
FIG. 8 is a graph of the linear response of the RF power amplifier output power with respect to the collector supply voltage and with respect to the bias output voltage.

FIG. 8 is a graph of the linear response of output power with respect to supply collector voltage 142 (see FIGS. 1-4) and with respect to bias output voltage 144 (see FIGS. 1-4). As shown in FIG. 8, the linear response indicates that the output power can be controlled in a predictable manner using an open loop technique by adjusting supply collector voltage 142 and/or bias output voltage 144. Measured results indicate a linear relationship between output power and supply voltage, and between output power and bias voltage for a silicon germanium switch-mode power amplifier. The linear relationship between output power and both supply voltage and bias voltage provides a robust and simple open-loop radio frequency transmitter output power control system, which only requires a single output power calibration to establish a setup table. Also, the power transistor is biased in the OFF stage during normal operation, which allows a simple and easy mechanism to power off the transmitter. Thus, the open-loop radio frequency transmitter output power control system reduces power consumption.

From the above description, it is manifest that various techniques can be used for implementing the concepts without departing from their scope. Moreover, a person of ordinary skill in the art would recognize that changes can be made in form and detail without departing from the spirit and the scope. The described embodiments are to be considered in all respects as illustrative and not restrictive. It should also be understood that the particular embodiments described herein are capable of many rearrangements, modifications, and substitutions without departing from the scope and spirit.

We claim:

1. A method, comprising:
   determining a desired RF output power and obtaining a battery voltage value from a battery;
   determining a supply control voltage and a bias control voltage and a highest power efficiency from said desired RF output power and said battery voltage value;
   transmitting selected values of said supply control voltage and said bias control voltage to supply control circuitry and bias control circuitry; and
   wherein said supply control circuitry comprises:
      an operational amplifier having a positive input, a negative input and an output, capable of receiving said supply control voltage via said negative input,
      a ground resistor having a first terminal operatively coupled to said positive input of said operational amplifier and having a second terminal operatively coupled to a ground,
      a collector resistor having first and second terminals, wherein said first terminal of said collector resistor is operatively coupled to said first terminal of said ground resistor and to said positive input of said operational amplifier, and
      a transistor having a source, a gate and a drain, wherein said source is operatively coupled to said battery and capable of receiving said battery voltage from said battery, and wherein said gate is operatively coupled to said output of said operational amplifier, and wherein said drain is operatively coupled to a power amplifier and said second terminal of said collector resistor and capable of transmitting said supply collector voltage.

2. The method of claim 1, wherein said determining said desired RF output power and obtaining said battery voltage value comprises determining said desired RF output power via user input.

3. The method of claim 1, wherein said determining said desired RF output power and obtaining said battery voltage value comprises obtaining said battery voltage value via a battery voltage monitor.

4. The method of claim 1, wherein said determining said supply control voltage, said bias control voltage and said highest power efficiency comprises determining said supply control voltage, said bias control voltage and said highest power efficiency rating using a lookup table.

5. The method of claim 1, wherein said bias control circuitry comprises:
a second operational amplifier having a positive input, a negative input and an output, capable of receiving said bias control voltage via said negative input of said second operational amplifier;
a second ground resistor having a first terminal operatively coupled to said positive input of said second operational amplifier and having a second terminal operatively coupled to said ground;
a second collector resistor having a first terminal operatively coupled to said first terminal of said second ground resistor and said positive input of said second operational amplifier and having a second terminal;
a bias control circuitry battery capable of transmitting a bias battery voltage;
a second transistor having a source, a gate and a drain, wherein said source is operatively coupled to said bias control circuitry battery and capable of receiving said bias battery voltage from said bias control circuitry battery, and wherein said gate is operatively coupled to said output of said second operational amplifier, and wherein said drain is operatively coupled to said second terminal of said second collector resistor and said power amplifier via an inductor and capable of transmitting said bias output voltage.

6. The method of claim 1, wherein said bias control circuitry comprises:
a second operational amplifier having a positive input, a negative input and an output, capable of receiving said bias control voltage via said negative input of said second operational amplifier and a bias clamp voltage via said positive input of said second operational amplifier;
a second transistor having an emitter, a base and a collector, wherein said collector is operatively coupled to said negative input of said second operational amplifier, and wherein said emitter is operatively coupled to said ground, and wherein said base is operatively coupled to said output of said second operational amplifier and capable of transmitting said bias output voltage.

7. A method, comprising:
determining a desired RF output power and obtaining a battery voltage value;
obtaining sets of values comprising a supply control voltage, a bias control voltage and a power efficiency rating for said desired RF output power and said battery voltage value using a lookup table;
selecting said supply control voltage and said bias control voltage having a highest power efficiency rating;
transmitting selected values of said supply control voltage and said bias control voltage to supply control circuitry and bias control circuitry; and
wherein said supply control circuitry comprises:
an operational amplifier having a positive input, a negative input and an output, capable of receiving said supply control voltage via said negative input,
a ground resistor having a first terminal operatively coupled to said positive input of said operational amplifier and having a second terminal operatively coupled to a ground,
a collector resistor having a first terminal operatively coupled to said first terminal of said ground resistor and said positive input of said operational amplifier and having a second terminal, and
a transistor having a source, a gate and a drain, wherein said source is operatively coupled to a battery and capable of receiving said battery voltage from said battery, and wherein said gate is operatively coupled to said output of said operational amplifier, and wherein said drain is operatively coupled to a power amplifier and said second terminal of said collector resistor and capable of transmitting said supply collector voltage.

8. The method of claim 7, wherein said determining said desired RF output power and obtaining said battery voltage value comprises determining said desired RF output power via user input.

9. The method of claim 7, wherein said determining said desired RF output power and obtaining said battery voltage value comprises determining said desired RF output power via user input.

10. The method of claim 7, wherein said bias control circuitry comprises:
a second operational amplifier having a positive input, a negative input and an output, capable of receiving said bias control voltage via said negative input of said second operational amplifier;
a second ground resistor having a first terminal operatively coupled to said positive input of said second operational amplifier and having a second terminal operatively coupled to said ground;
a second collector resistor having a first terminal operatively coupled to said first terminal of said second ground resistor and said positive input of said second operational amplifier and having a second terminal;
a bias control circuitry battery capable of transmitting a bias battery voltage;
a second transistor having a source, a gate and a drain, wherein said source is operatively coupled to said bias control circuitry battery and capable of receiving said bias battery voltage from said bias control circuitry battery, and wherein said gate is operatively coupled to said output of said second operational amplifier, and wherein said drain is operatively coupled to said second terminal of said second collector resistor and said power amplifier via an inductor and capable of transmitting said bias output voltage.

11. The method of claim 7, wherein said bias control circuitry comprises:
a second operational amplifier having a positive input, a negative input and an output, capable of receiving said bias control voltage via said negative input of said second operational amplifier and a bias clamp voltage via said positive input of said second operational amplifier;
a second transistor having an emitter, a base and a collector, wherein said collector is operatively coupled to said negative input of said second operational amplifier, and wherein said emitter is operatively coupled to said ground, and wherein said base is operatively coupled to said output of said second operational amplifier and capable of transmitting said bias output voltage.

12. A method, comprising:

determining a desired RF output power and obtaining a battery voltage value;

determining a supply control voltage, a bias control voltage and a highest power efficiency based on said desired RF output power and said battery voltage value;

transmitting selected values of said supply control voltage and said bias control voltage to supply control circuitry and bias control circuitry;

transmitting a bias output voltage and a supply collector voltage to a power amplifier;

generating an RF output signal in response to an RF input signal, said bias output voltage and said supply collector voltage; and wherein said supply control circuitry comprises:

an operational amplifier having a positive input, a negative input and an output, capable of receiving said supply control voltage via said negative input, a ground resistor having a first terminal operatively coupled to said positive input of said operational amplifier and having a second terminal operatively coupled to a ground, a collector resistor having a first terminal operatively coupled to said first terminal of said ground resistor and said positive input of said operational amplifier and having a second terminal, and a transistor having a source, a gate and a drain, wherein said source is operatively coupled to a battery and capable of receiving said battery voltage from said battery, and wherein said gate is operatively coupled to said output of said operational amplifier, and wherein said drain is operatively coupled to said power amplifier and said second terminal of said collector resistor and capable of transmitting said supply collector voltage.

13. The method of claim 12, wherein said determining said desired RF output power and obtaining said battery voltage value comprises determining said desired RF output power via user input.

14. The method of claim 12, wherein said determining said desired RF output power and obtaining said battery voltage value comprises obtaining said battery voltage value via a battery voltage monitor.

15. The method of claim 12, wherein said bias control circuitry comprises:

second operational amplifier having a positive input, a negative input and an output, capable of receiving said bias control voltage via said negative input of said second operational amplifier;

a second ground resistor having a first terminal operatively coupled to said positive input of said second operational amplifier and having a second terminal operatively coupled to said ground;

a second collector resistor having a first terminal operatively coupled to said first terminal of said second ground resistor and said positive input of said second operational amplifier and having a second terminal;

a bias control circuitry battery capable of transmitting a bias battery voltage;

a second transistor having a source, a gate and a drain, wherein said source is operatively coupled to said bias control circuitry battery and capable of receiving said bias battery voltage from said bias control circuitry battery, and wherein said gate is operatively coupled to said output of said second operational amplifier, and wherein said drain is operatively coupled to said second terminal of said second collector resistor and said power amplifier via an inductor and capable of transmitting said bias output voltage.

16. The method of claim 12, wherein said bias control circuitry comprises:

a second operational amplifier having a positive input, a negative input and an output, capable of receiving said bias control voltage via said negative input of said second operational amplifier and a bias clamp voltage via said positive input of said second operational amplifier; and a second transistor having an emitter, a base and a collector, wherein said collector is operatively coupled to said negative input of said second operational amplifier, and wherein said emitter is operatively coupled to said ground, and wherein said base is operatively coupled to said output of said second operational amplifier and capable of transmitting said bias output voltage.

* * * * *